PROTECTION CIRCUIT FOR HORIZONTAL OUTPUT TRANSISTOR

Filed Dec. 21, 1966

Inventors
Erwin J. Dreiske
Emanuel Saudinaitis
By James E. Tracy
Attorney

Inventors
Erwin J. Dreiske
Emanuel Saudinaitis
By James E. Tracy
Attorney

United States Patent Office 3,434,005

Patented Mar. 18, 1969

3,434,005

PROTECTION CIRCUIT FOR HORIZONTAL OUTPUT TRANSISTOR

Erwin J. Dreiske, Oak Park, and Emanuel Saudinattis, Glencoe, Ill., assignors to Zenith Radio Corporation, Chicago, Ill., a corporation of Delaware Filed Dec. 21, 1966, Ser. No. 603,537
U.S. Cl. 315—27 8 Claims
Int. Cl. H01j *29/76;* H02h *7/20*

ABSTRACT OF THE DISCLOSURE

Malfunctioning, such as arcover, of the high voltage rectifier of a transistorized television horizontal scanning and high voltage generating system permits the high voltage filter capacitance to discharge through the rectifier and the secondary winding of the horizontal output transformer and this in turn causes high amplitude current to be transformed back to the horizontal output transistor, as a result of which the transistor may suffer permanent damage. Protection against such damage is obtained by developing a control pulse, in response to the discharging of the capacitance, and utilizing that pulse to drive the output transistor to cutoff thereby preventing the translation of current through the transistor.

Figure 1:
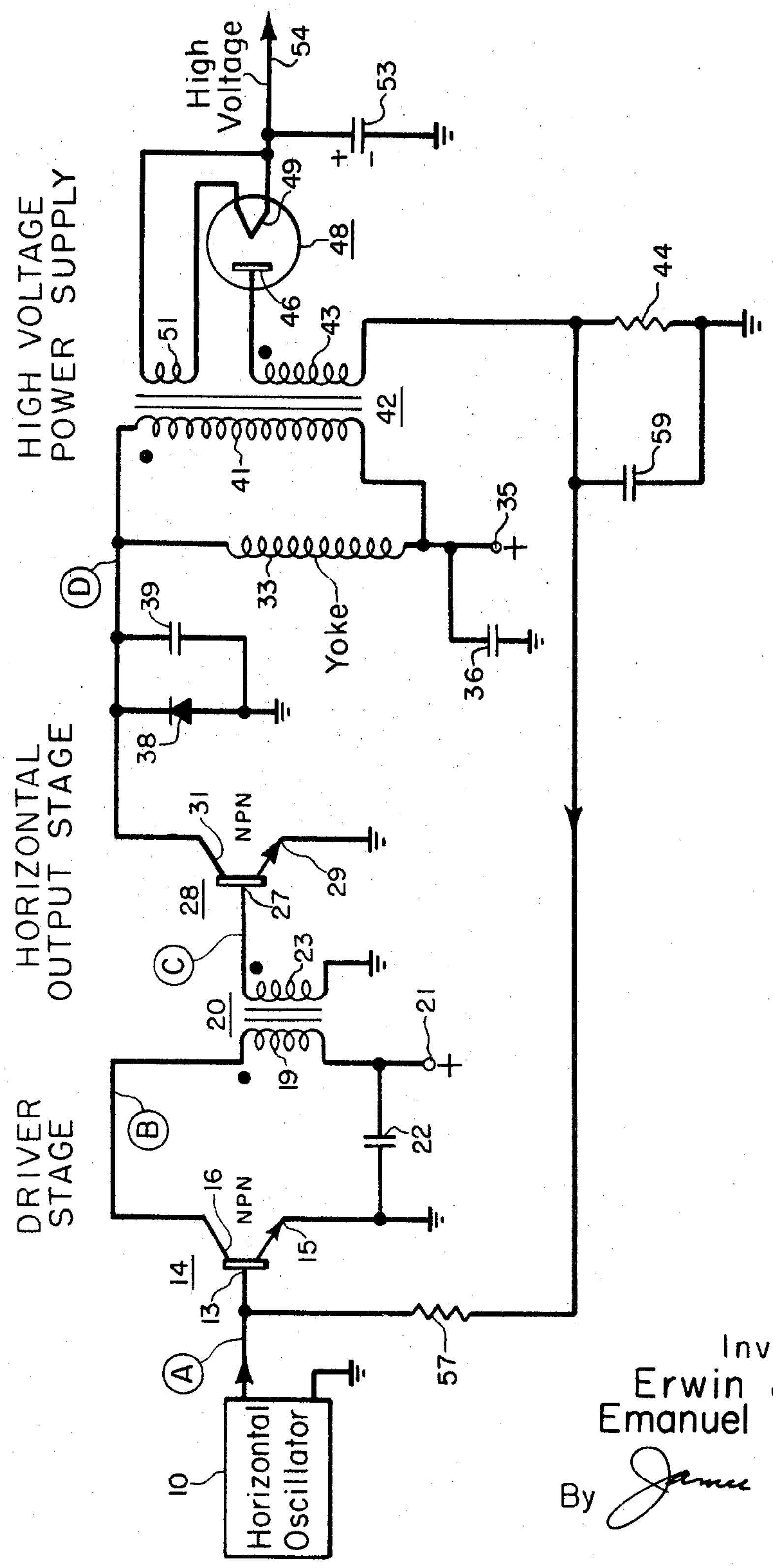

This invention pertains to a circuit for protecting, against permanent damage, the output transistor of a transistorized horizontal scanning and high voltage generating system for a television receiver—damage that may otherwise occur as a result of malfunctioning of the high voltage generating portion of the system.

In a conventional television receiver, horizontal deflection or sweeping of the electron beam of the picture tube is achieved by developing a periodically recurring sawtooth current waveform in an inductive magnetic deflection yoke. When the scanning system is transistorized, the development of such a deflection signal is usually accomplished by a horizontal output stage essentially comprising an output transistor (which functions as an electronic switch), the emitter-collector path of which is coupled in series with the deflection yoke and a D.C. voltage source of fixed magnitude. The transistor is alternately actuated (either directly by a horizontal oscillator or by a driver stage driven by an oscillator) between its conductive or ON condition and its nonconductive or OFF condition in order to effectively alternately connect and disconnect the D.C. voltage source and the yoke. Each ON-time interval of the output transistor embraces approximately the second half of a horizontal trace interval and each OFF-time interval coincides with approximately the first half of a trace interval plus a retrace interval. Because of the inductive nature of the yoke, applying a fixed potential thereto during the ON-time of the electronic switch results in linearly increasing current flow through the yoke in one direction. In response to turning the switch or transistor OFF, the yoke current ceases to increase and a retrace interval is initiated. A damper or recovery diode, connected in shunt with the switch, translates the yoke current during the first half of each line-trace interval. During that time linearly decreasing current flows through the yoke in the other direction.

When the output transistor is turned OFF at the end of a trace interval to terminate the increasing yoke current, the stored magnetic field in the yoke tends to collapse and this results in the development of a relatively high amplitude retrace or flyback voltage pulse across the yoke.

The high magnitude D.C. potential, required for the second anode of the picture tube, is usually generated or developed from the retrace voltage pulses. The primary winding of a step-up horizontal output transformer is coupled in shunt with the yoke and a secondary winding is coupled in series with a high voltage rectifier and a filter capacitance. The rectifier rectifies stepped-up or voltage-amplified retrace pulses to charge the capacitance and develop thereacross a unidirectional potential of a magnitude appropriate for application to the picture tube anode.

Since the transistor of the horizontal output stage is transformer coupled to the high voltage power supply, malfunctioning of the rectifier can inflict permanent damage to that transistor. To explain, the rectifier of the power supply normally conducts in only one direction and the filter capacitance is charged at all times to the high D.C. potential generated by the power supply. The high potential across the capacitance may cause breakdown of the rectifier in which case current is permitted to flow through the rectifier in the reverse direction, causing the capacitance to discharge rapidly through the series-connected rectifier and high voltage secondary winding. For example, the rectifier may be of the vacuum tube type having spaced-apart anode and cathode elements. Current, of course, ordinarily is permitted to flow only from anode to cathode but the high potential on the capacitance may cause an arcover in the rectifier tube from cathode to anode, as a result of which the capacitance discharges in the direction from cathode to anode and through a relatively low impedance path provided by the rectifier and secondary winding thereby producing a high amplitude current pulse in the secondary of the output transformer. A high amplitude current pulse in the secondary winding is transformed back to the primary winding at a still higher amplitude (the transformer steps up current in going from the secondary to the primary) which may be high enough to burn out and destroy the horizontal output transistor.

To explain, the duration of a current pulse through the high voltage secondary, produced by arcing in the high voltage rectifier tube, will usually be sufficiently wide to embrace at least one complete cycle of the sawtooth current supplied to the yoke. Thus, high amplitude current flows in the secondary during an interval in which the output transistor is in its conductive state (namely, driven into saturation) and this will permit the development, from the secondary current, of a high amplitude current in the primary which is translated through the emitter-collector path of the saturated transistor. The transformed current will usually be so high that the transistor is taken out of its saturated state, thereby establishing the collector at a potential substantially different than the emitter potential. While the transistor is in its ON condition the collector current continues to increase and the voltage difference between the collector and emitter continues to increase. The high collector current in combination with the high voltage difference across the collector and emitter results in a substantial power dissipation which in turn produces heat to such an extent that the transistor may burn out and suffer permanent damage.

If the high current during the ON-time of the transistor does not result in its destruction, damage may subsequently occur when a turn-OFF pulse is applied to the base of the transistor. At that time, the transistor begins to turn OFF as a result of which the collector current begins to decrease from its high amplitude causing the collector voltage to rise rapidly. The collector-emitter voltage difference will increase to a dangerous level while there is still collector current flow and this may result in a power dissipation and consequent heat of a magnitude to destroy the transistor.

The present invention overcomes this serious shortcoming of prior transistorized horizontal sweep and high voltage generating systems and provides a novel protection circuit that makes the horizontal output transistor immune to any malfunctioning of the high voltage rectifier, and particularly immune to arcover of a tube-type rectifier. Moreover, such protection is accomplished by means of a relatively inexpensive circuit arrangement.

Accordingly, it is an object of the present invention to provide a new and improved horizontal scanning and high voltage generating system for a television receiver.

It is another object of the invention to provide a novel protection circuit for insuring the horizontal output transistor of a television receiver against damage that may otherwise be occasioned by improper operation of the high voltage rectifier.

A horizontal scanning and high voltage generating system for a television receiver, constructed in accordance with one aspect of the invention, comprises an output transistor to which is coupled a magnetic deflection yoke. Means including the output transistor develop in the yoke a periodically recurring sawtooth current waveform having during each cycle a trace interval and a retrace interval. A horizontal output transformer is provided which has a primary winding coupled to the yoke and a secondary winding across which is developed a high amplitude voltage pulse during each of the retrace intervals. There is a high voltage power supply, including the secondary winding, a high voltage rectifier and a filter capacitance, which responds to the retrace voltage pulses to charge the capacitance and develop thereacross a unidirectional potential of relatively high magnitude. The rectifier is subject to malfunctioning in which event the capacitance discharges through the rectifier and secondary winding tending to effect the translation of high amplitude current through the output transistor. The system also includes means responsive to such discharging of the capacitance for cutting the output transistor OFF to prevent the translation of high amplitude current therethrough in order to protect the transistor against permanent damage.

Figure 2:
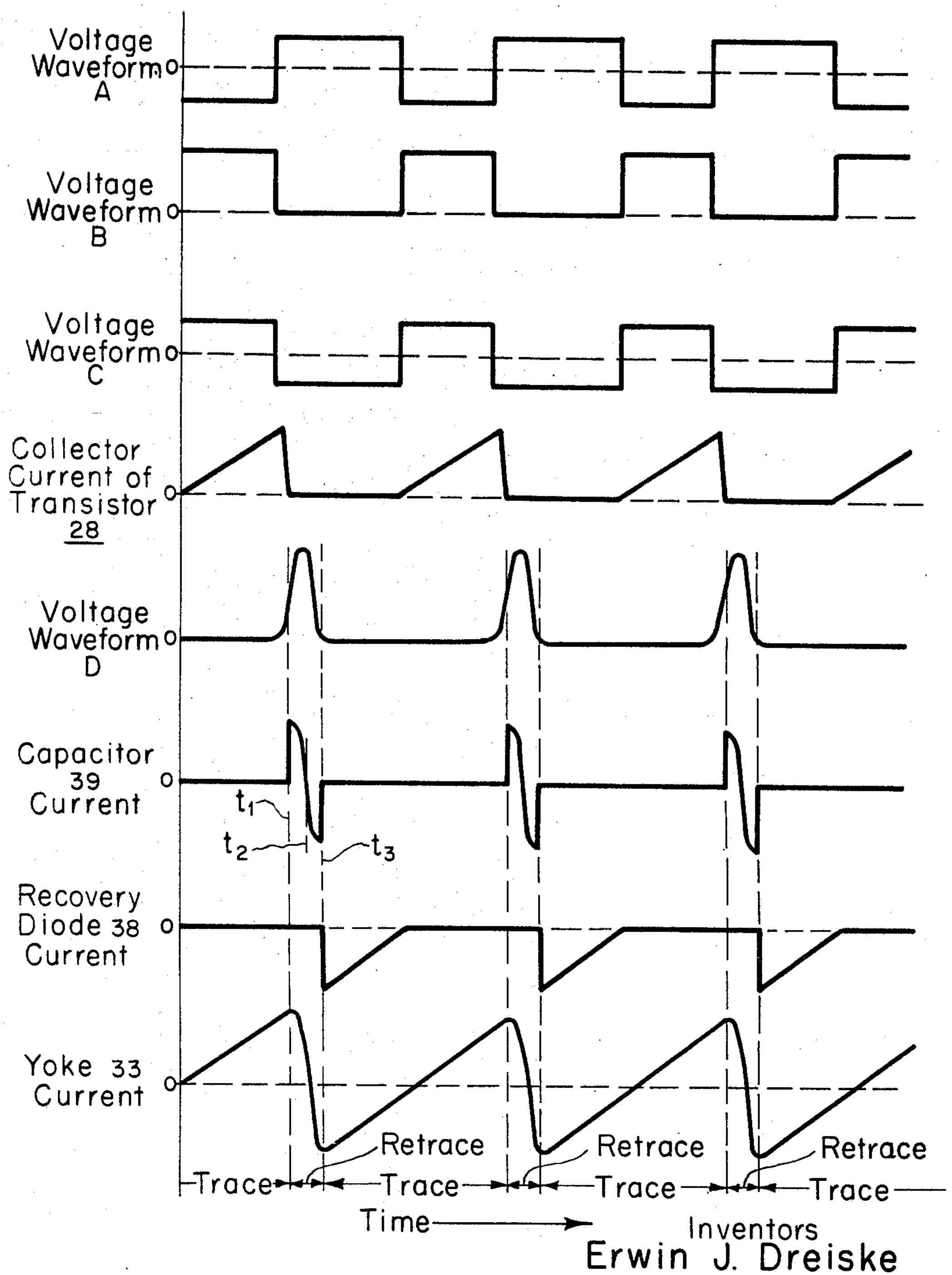

The features of this invention which are believed to be new are set forth with particularity in the appended claims. The invention, together with further objects and advantages thereof, may best be understood, however, by reference to the following description in conjunction with the accompanying drawings, in which:

FIGURE 1 is a schematic diagram of a horizontal sweep and high voltage generating system, constructed in accordance with one embodiment of the invention, which may be incorporated in a conventional television receiver; and, FIGURE 2 comprises various signal waveforms helpful in explaining the operation of the system of FIGURE 1.

Turning now to a structural description of the system of FIGURE 1, block 10 represents a horizontal oscillator of a television receiver for producing an alternating signal (specifically a rectangular shaped signal) having a frequency equal to the horizontal- or line-scanning frequency of the receiver. Preferably, oscillator 10 is free running and is automatic frequency controlled (by circuitry not shown) to insure that precise frequency and phase synchronism is maintained between the horizontal synchronizing pulses of a received television signal and the scanning signal developed in the horizontal deflection yoke (to be described) for the picture tube. A rectangular wave output of oscillator 10 may be achieved by any of a variety of different circuit arrangements. For example, oscillator 10 may be of conventional Hartley type construction, such as is disclosed in Patent 3,205,452, issued Sept. 7, 1965, to Emanuel Saudinaitis, and assigned to the present assignee. In that patent, a sinusoidal voltage, developed across a tank circuit, is of sufficient magnitude to drive a transistor alternately between saturation and cutoff to effectively convert the sinusoidal signal to one of rectangular waveform.

The output signal of the horizontal oscillator is applied to the input terminals of a driver or amplifier stage. One output terminal of oscillator 10 is connected to a plane of reference potential such as ground, while the other output terminal is connected to the base 13 of a junction-type transistor 14 of NPN gender, the emitter 15 of the transistor being grounded. The collector 16 is coupled through the primary winding 19 of a transformer 20 to the positive terminal 21 of a source of unidirectional or D.C. operating potential, the negative terminal of which is grounded. Positive potential source 21 is also coupled to ground through an A.C. bypass or decoupling capacitor 22.

The output of the driver stage is coupled to the input of a horizontal output stage. One terminal of secondary winding 23 of transformer 20 is grounded while the other terminal is connected to the base 27 of a junction-type transistor 28 of NPN variety, the emitter 29 of which is connected to ground. Collector 31 is connected to one terminal of a substantially inductive magnetic deflection yoke 33, the other terminal of which is connected to the positive terminal 35 of a source of unidirectional operating potential, the negative terminal being grounded. With this arrangement, a series circuit is provided which includes positive potential source 35, deflection yoke 33, and the emitter-collector conduction path of output transistor 28. Positive terminal 35 is also coupled to ground via an A.C. bypass or decoupling capacitor 36.

A recovery or damper diode 38, shunted by a capacitor 39, is coupled between the upper terminal of yoke 33 and ground. Specifically, the cathode terminal of diode 38 is directly connected to the upper terminal of the yoke, while the anode of the damper diode is grounded.

The primary winding 41 of a horizontal output transformer 42 is connected in parallel with yoke 33. High voltage secondary winding 43 of the transformer has its lower terminal coupled through a resistor 44 to ground and its upper terminal connected to the plate or anode 46 of a high voltage rectifier tube 48. The filament-cathode 49 of rectifier 48 is coupled to another winding 51 of transformer 42 to receive heater power. One side of filament cathode 49 is connected to the upper terminal of a filter capacitor 53, the lower terminal of which is grounded. An output connection 54 is provided at the upper terminal of capacitance 53 to supply high voltage to the second anode of a conventional picture tube. While capacitor 53 is illustrated in FIGURE 1 as a discrete circuit element, this is not necessary. The capacitance of capacitor 53 may be provided by the picture tube capacitance existing between the second anode and ground.

In accordance with a salient feature of the invention, a feedback circuit is provided between the high voltage power supply and the input terminals of output transistor 28 to apply a control voltage pulse to that transistor to turn it OFF in response to malfunctioning of rectifier tube 48, such as arcing from cathode 49 to anode 46. Such feedback is obtained by connecting the upper terminal of resistor 44 to base 13 of driver transistor 14 through a resistor 57. As will be described, a positive polarity voltage pulse develops across resistor 44 when there is an arcover in tube 48. Since the driver stage is essentially an amplifier, any signal supplied to its input terminals is applied in amplified form to the input terminals of the output stage. By connecting resistor 44 to the input of the driver, rather than to the input of the output stage, the gain of the driver stage is utilized to amplify the control voltage pulse to a magnitude sufficient to cut transistor 28 OFF. Resistor 57 is included in the feedback connection to isolate the output of oscillator 10 and resistor 44. A capacitor 59 is coupled in shunt with resistor 44 to attenuate or damp any ringing that may be caused by the control voltage pulse.

In describing the operation of the scanning and high voltage generating system of FIGURE 1, reference is also made to the idealized voltage and current signal waveforms of FIGURE 2 which appear at various points in the circuit of FIGURE 1. There are four voltage waveforms in FIGURE 2, identified by letter designations A–D, respectively, and the terminals in the circuit of FIGURE 1 at which these various voltages appear are indicated by corresponding encircled letters. The operation of the system will initially be described with the assumption that high voltage rectifier tube 48 functions properly.

Horizontal oscillator 10 develops at its output terminals the voltage signal of waveform A which is of rectangular waveshape, having pulse components of alternating polarity, and has a frequency equal to the horizontal scanning frequency of the television set. The signal is applied between base 13 and emitter 15 of driver transistor 14 to switch the transistor alternately between its conductive and nonconductive states. Specifically, in response to each positive pulse component of waveform A base 13 is established at a positive potential with respect to the emitter potential, and since transistor 14 is of the NPN variety those positive pulses forward bias the base-emitter junction to the extent that the transistor is driven into its saturated condition. Current therefore flows from positive potential source 21 through primary winding 19 and the collector-emitter path of transistor 14 toward ground. Each negative pulse component of voltage waveform A reverse biases the base-emitter junction of transistor 14, turning the transistor OFF with the result that emitter-collector current flow terminates.

During the intervals in which transistor 14 is in its OFF condition, collector 16 (and therefore the upper terminal of winding 19) is established at a positive potential with respect to ground, whereas during the intervening intervals in which the transistor is driven to its ON condition, the collector is effectively connected to emitter 15 thereby clamping the collector to ground potential. Hence, the voltage waveform appearing at collector 16 is that shown by curve B in FIGURE 2. The signal is the 180° counterpart of waveform A, having an amplitude which switches from one level to the other each time transistor 14 is actuated from one condition to the other. Since collector 16 is essentially clamped to ground when transistor 14 is ON, the three pulse components of waveform B established at zero or ground potential, which is the lowermost amplitude level, designate the ON-time intervals of the transistor. Conversely, the three positive pulses of curve B indicate the OFF-times of transistor 14. The relative durations of the positive and negative pulses of waveform B may vary. In the illustrated embodiment, the positive components are narrower than the negative components but this is not essential. If desired, the driver stage may be operated such that waveform B constitutes a square wave with positive and negative components of equal time duration.

The rectangular shaped voltage signal of waveform B is transformed and translated by transformer 20 to base 27 of output transistor 28. Windings 19 and 23 of the transformer are wound polarity-wise so that no phase inversion occurs from primary to secondary. Hence, the waveform of the voltage signal appearing at the upper terminal of secondary winding 23 is in phase with the signal at the upper terminal of primary winding 19. The voltage signal applied to base 27 will therefore have the waveform shown by curve C. Due to the transformer coupling provided by transformer 20, the signal has no D.C. component and thus the A.C. axis of waveform C coincides with zero or ground potential. The signal of waveform B will be transformed to a lower impedance signal because of transformer 20, and the signal of curve B will be voltage amplified with respect to the signal of waveform A as a result of the voltage amplification introduced by driver transistor 14. For convenience of illustration, the relative amplitudes of the signals of curves A, B and C have not been shown in FIGURE 2.

Each positive pulse of waveform C is applied across the base-emitter junction of transistor 28 and is of sufficient magnitude to forward bias the junction and establish transistor 28 in its saturated or ON state. Current is thus translated in the output circuit of transistor 28 in the direction from positive potential source 35, through yoke 33 and primary winding 41 in parallel, and then through the collector-emitter path of transistor 28 to ground. Because of the inductive nature of yoke 33 and primary 41, the amplitude of the collector current increases from zero in substantially linear fashion, as shown by the collector current waveform in FIGURE 2. The current rises linearly from zero, starting at the instant transistor 28 is rendered conductive by a positive voltage pulse of waveform C. Recovery of damper diode 38 may be ignored while transistor 28 is turned ON inasmuch as potential source 35 establishes the cathode of diode 38 positive with respect to its anode, thereby rendering the diode cut off. Transistor 28 remains conductive and its collector current continues to increase linearly until the instant at which waveform C changes from positive to negative polarity. At that time, base 27 becomes negative with respect to emitter 29 to the extent necessary to reverse bias the base-emitter junction and render transistor 28 nonconductive, thereby terminating the flow of collector current.

At the instant device 28 is turned OFF the linearly increasing current, flowing through the yoke and winding 41 in the direction from collector 31 to emitter 29, is abruptly terminated as shown in FIGURE 2. When the yoke and primary winding current cease to increase, the magnetic fields which build up in yoke 33 and transformer 42 during the interval of rising current tend to collapse, and this results in the development of a relatively high amplitude retrace or flyback voltage pulse across yoke 33 and primary 41. As viewed at the upper terminals of the yoke and primary winding with respect to ground, the retrace voltage pulses are of positive polarity as shown by waveform D in FIGURE 2. In conventional manner, the retrace voltage pulses of curve D are transformed from primary 41 to secondary 43 at a voltage step-up ratio in order that higher potential pulses are applied across the series circuit including high voltage rectifier 48, filter capacitance 53 and resistor 44. Transformer 42 is so wound that the high amplitude voltage pulses developed across secondary 43 are of positive polarity as viewed at the upper terminal of the secondary winding with respect to its lower terminal.

Since rectifier 48 is poled to normally conduct only in the direction from anode 46 to cathoed 49, the positive retrace voltage pulses produced at the upper terminal of secondary 43 effect conduction of the rectifier with the result that capacitance 53 is charged. The load impedance provided by the picture tube is sufficiently high that capacitor 53 loses relatively little of its charge during the trace intervals intervening the retrace intervals. As a consequence, capacitance 53 charges substantially to the peak amplitude of the positive pulses applied to anode 46 and retains that charge condition. Thus, a unidirectional potential of relatively high and constant magnitude, with the polarity indicated in FIGURE 1, is developed across capacitance 53 for application, via connection 54, to the second anode of a conventional picture tube. The resistance of resistor 44 preferably is small, for example 100 ohms.

At the end of each line-trace interval the collapsing magnetic fields in yoke 33 and primary 41 also effect cosinusoidal current flow into capacitor 39. This is shown by the current waveform for that capacitor in FIGURE 2 during the first half of each retrace interval embraced by the indicia $t_1$–$t_2$. During the second half of each retrace interval, namely during the period defined by the indicia $t_2$–$t_3$, current flows out of capacitor 39 and into yoke 33 and primary winding 41. At time $t_3$, the energy stored in the yoke and primary produce linearly decreasing current, enduring for approximately one-half of the trace interval, out of the yoke and primary and through diode 38, as shown by the recovery diode 38 current waveform in FIGURE 2.

As shown by the collector current waveform of transistor 28, current flows from positive potential source 35 and through yoke 33 and primary 41 in one direction during the second half of each trace interval, while the energy remaining at the end of retrace in the yoke and primary winding effect current flow through yoke 33 and primary 41 in the opposite direction during the first half of each trace interval, as evidenced by the diode 38 current waveform. The yoke current is also shown in FIGURE 2. During trace it is a combination of that flowing through transistor 28 and recovery diode 38, and during retrace it is cosinusoidal since it is the same current that flows through capacitor 39.

As thus far described, the high voltage power supply performs properly and rectifier 48 conduts in only one direction to rectify the high amplitude retrace voltage pulses produced across secondary winding 43. In case of malfunctioning of rectifier 48, such as an arcover from cathode 49 to anode 46 produced by the high voltage across capacitor 53, the capacitance discharges through the rectifier and secondary winding and in so doing translates high amplitude current through the rectifier in the reverse direction. However, in accordance with the invention, that high amplitude reverse current will not have a deleterious effect on output transistor 28 and thus the transistor will suffer no permanent damage.

To explain, the high D.C. voltage across capacitance 53 is essentially applied across rectifier 48 with cathode 49 being established at a positive potential with respect to anode 46. If the rectifier tube is defective, the high voltage may cause arcing from cathode 49 to anode 46 in which case a low-impedance discharge circuit is completed from the upper terminal of capacitance 53 through rectifier 48, secondary 43, and resistor 44 to ground. Capacitance 53 discharges through that path and a high amplitude current pulse is consequently transformed from secondary 43 to primary 41 which, in the absence of the invention, could result in collector current buildup to a level high enough to cause the destruction of transistor 28. In the discharging process, however, a positive control voltage pulse is produced across resistor 44 which is utilized to effect turning OFF of transistor 28 before its collector current can build up to a dangerous level. The positive voltage pulse is supplied through resistor 57 to base 13 and will be of sufficient magnitude to drive transistor 14 into its saturated condition, resulting in the application of a negative voltage pulse to base 27 of an amplitude adequate to render transistor 28 nonconductive. The action initiated by the control pulse occurs so fast that the output transistor is turned OFF before its collector current has an opportunity to increase to a destructive level.

As a consequence, output transistor 28 is immune from the destructive effects ordinarily resulting from arcing of rectifier tube 48. With the protection circuit, at no time will there be a combination of high current through and high voltage across the output transistor to produce a power dissipation and resulting heat great enough to burn the transistor out.

The invention provides, by way of summary, a novel horizontal scanning and high voltage generating system having an output transistor 28 that is prevented from translating high amplitude current (and thus is protected against permanent damage) that may otherwise be transformed back to the transistor by horizontal output transformer 42 as a result of high amplitude current flow through secondary winding 43 occasioned by malfunctioning of rectifier 48, particularly arcover in the rectifier which permits capacitance 53 to discharge through the secondary. The deleterious effect of the secondary winding current is nullified in the illustrated embodiment by inserting a resistor 44 in series with winding 43 to sense or monitor the current which flows during an arcover. A voltage pulse is developed across the resistor at that time and is fed back to transistor 14 to drive it into saturation which in turn drives output transistor 28 to cutoff and this condition is reached before the collector current of transistor 28 can escalate to a destructive level.

While a particular embodiment of the invention has been shown and described, modifications may be made, and it is intended in the appended claims to cover all such modifications as may fall within the true spirit and scope of the invention.

We claim:

1. A horizontal scanning and high voltage generating system for a television receiver, comprising:

an output transistor;

a magnetic deflection yoke coupled to said transistor;

means including said output transistor for developing in said yoke a periodically recurring sawtooth current waveform having during each cycle a trace interval and a retrace interval;

a horizontal output transformer having a primary winding coupled to said yoke and having a secondary winding across which is developed a high amplitude voltage pulse during each of said retrace intervals;

a high voltage power supply, including said secondary winding, a high voltage rectifier and a filter capacitance, responsive to the retrace voltage pulses for charging said capacitance to develop thereacross a unidirectional potential of relatively high magnitude, said rectifier subject to malfunctioning in which event said capacitance discharges through said rectifier and secondary winding tending to effect the translation of high amplitude current through said output transistor;

and means responsive to such discharging of said capacitance for cutting said output transistor OFF to prevent the translation of high amplitude current therethrough in order to protect said transistor against permanent damage.

2. A horizontal scanning and high voltage generating system for a television receiver, comprising:

a horizontal output stage including an output transistor having input and output terminals;

a magnetic deflection yoke coupled to the output terminals of said transistor;

means for supplying a drive signal to the input terminals of said transistor to alternately render said transistor conductive and nonconductive and for developing in said yoke a periodically recurring sawtooth current waveform having during each cycle a trace interval and a retrace interval;

a horizontal output transformer having a primary winding coupled to said yoke and having a high voltage secondary winding across which is developed a high amplitude voltage pulse during each of said retrace intervals;

a filter capacitance;

a high voltage rectifier, coupled in series with said secondary winding and said capacitance, conducting in a predetermined direction to rectify the retrace voltage pulses and to develop across said capacitance a unidirectional potential of relatively high magnitude, said rectifier subject to malfunctioning in which event a high amplitude current pulse flows through said rectifier in the reverse direction thereby causing the development in said primary winding of a high amplitude current pulse that may permanently damage said output transistor;

and control means responsive to the flow of any such reverse current through said rectifier for rendering said output transistor nonconductive to nullify the deleterious effect of that reverse current.

3. A system according to claim 2 in which said rectifier is a tube having an anode and a cathode with the predetermined direction of conduction being from anode to cathode and the reverse direction being from cathode to anode, and in which the malfunctioning of said rectifier is an arcover from cathode to anode produced by the high voltage across said capacitance.

4. A system according to claim 2 in which said rectifier, secondary winding and capacitance constitute a high voltage power supply and in which said control means includes a feedback circuit from said power supply to the input terminals of said output transistor.

5. A system according to claim 2 in which said control means senses the presence of reverse current flow through said rectifier and develops therefrom a pulse which is fed back to the input terminals of said output transistor with a magnitude and polarity to cut the transistor OFF.

6. A system according to claim 2 in which said control means includes a resistor, coupled in series with the series arrangement of said rectifier, secondary winding and capacitance, for developing a control voltage pulse in response to the flow of reverse current through said rectifier, and in which said control means utilizes said control pulse to turn said output transistor OFF.

7. A system according to claim 2 in which said drive signal supplying means includes a driver stage having a driver transistor which is turned ON to effect cutoff of said output transistor and is rendered nonconductive to cause said output transistor to be turned ON, and in which said control means, responsive to reverse current flow in said rectifier, renders said driver transistor conductive to in turn cause said output transistor to be nonconductive.

8. A horizontal scanning and high voltage generating system for a television receiver, comprising:

a horizontal output stage including an output transistor having input and output terminals;

a magnetic deflection yoke coupled to the output terminals of said transistor;

means coupled to the input terminals of said transistor for alternately turning the transistor ON and OFF and for developing in said yoke a periodically recurring sawtooth current waveform having during each cycle a trace interval and a retrace interval;

a horizontal output transformer having a primary winding coupled to said yoke and having a high voltage secondary winding across which is developed a high amplitude voltage pulse during each of said retrace intervals;

a series circuit including, in the order named, a filter capacitance, a high voltage rectifier tube, and said secondary winding, said rectifier being poled to conduct in the direction from said secondary winding to said capacitance to rectify the retrace voltage pulses and to develop across said capacitance a unidirectional potential of relatively high magnitude, but subject to arcover in which event a high amplitude current pulse flows through said rectifier in the reverse direction from said capacitance to said secondary winding thereby causing the development in said primary winding of a high amplitude current pulse that may permanently damage said output transistor;

a resistor included in said series circuit between said secondary winding and said capacitance for developing a control pulse in response to the flow of reverse current through said rectifier;

and means for utilizing said control pulse to render said output transistor nonconductive to nullify the deleterious effect of that reverse current.

References Cited

UNITED STATES PATENTS 3,343,061 9/1967 Heterscheid et al. -- 315—27 XR

RODNEY D. BENNETT, *Primary Examiner.*

CHARLES L. WHITHAM, *Assistant Examiner.*